US011930655B2

(12) United States Patent
Jeong et al.

(10) Patent No.: US 11,930,655 B2
(45) Date of Patent: Mar. 12, 2024

(54) DISPLAY DEVICE INCLUDING TOUCH SENSOR AND MANUFACTURING METHOD FOR THE SAME

(71) Applicant: LG DISPLAY CO., LTD., Seoul (KR)

(72) Inventors: Seongwoong Jeong, Gyeonggi-do (KR); Minkyu Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/365,230

(22) Filed: Jul. 1, 2021

(65) Prior Publication Data
US 2022/0190278 A1 Jun. 16, 2022

(30) Foreign Application Priority Data
Dec. 11, 2020 (KR) .................. 10-2020-0172880

(51) Int. Cl.
H10K 59/40 (2023.01)
G06F 3/041 (2006.01)
G06F 3/044 (2006.01)
H10K 50/813 (2023.01)
H10K 59/12 (2023.01)
H10K 59/131 (2023.01)
H10K 71/00 (2023.01)

(52) U.S. Cl.
CPC ........... H10K 50/813 (2023.02); G06F 3/044 (2013.01); H10K 59/131 (2023.02); H10K 59/40 (2023.02); H10K 71/00 (2023.02); G06F 3/0412 (2013.01); H10K 59/1201 (2023.02)

(58) Field of Classification Search
CPC ............... H01L 51/5209; H01L 27/323; H01L 27/3276; H01L 51/56; H01L 2227/323; G06F 3/044

USPC ................................. 257/100; 345/173–174
See application file for complete search history.

(56) References Cited

U.S. PATENT DOCUMENTS 9,710,090 B2 7/2017 Choi
10,168,844 B2 * 1/2019 Kwon .................... G06F 3/0446
10,403,692 B2 * 9/2019 Park ....................... G06F 3/0412
(Continued)

FOREIGN PATENT DOCUMENTS

JP 2005-26667 A 9/2005
JP 2016-006516 A 1/2016
(Continued)

OTHER PUBLICATIONS

First Office Action dated Sep. 7, 2022, issued in corresponding Taiwan Patent Application No. 110125029.
(Continued)

*Primary Examiner* — Kwin Xie
(74) *Attorney, Agent, or Firm* — Morgan, Lewis & Bockius LLP

(57) ABSTRACT

A display device is provided that includes a substrate including an active area and a non-active area, a planarization film disposed over the substrate, an anode electrode disposed on the planarization film and including a first hole in the non-active area, a bank disposed on the anode electrode, a cathode electrode disposed on the bank, an encapsulation layer disposed on the cathode electrode, and a touch sensor disposed on the encapsulation layer and including a touch line in the non-active area. Here, the first hole may be disposed not to overlap with the touch line.

18 Claims, 10 Drawing Sheets

(56) References Cited

U.S. PATENT DOCUMENTS

| | | | |
|---|---|---|---|
| 10,691,237 B2 * | 6/2020 | Cho | H10K 59/40 |
| 2005/0206309 A1 | 9/2005 | Shibasaki et al. | |
| 2013/0009162 A1 | 1/2013 | Kang | |
| 2014/0159002 A1 | 6/2014 | Lee et al. | |
| 2014/0225838 A1 | 8/2014 | Gupta et al. | |
| 2015/0001482 A1 * | 1/2015 | Jung | G06F 3/0445 |
| | | | 257/40 |
| 2015/0130726 A1 * | 5/2015 | Min | G06F 3/0443 |
| | | | 345/173 |
| 2015/0145808 A1 * | 5/2015 | Cho | G06F 3/0446 |
| | | | 345/174 |
| 2016/0315135 A1 | 10/2016 | Choi | |
| 2016/0378224 A1 * | 12/2016 | Kwon | H10K 59/38 |
| | | | 345/174 |
| 2017/0025489 A1 | 1/2017 | Choi et al. | |
| 2018/0004345 A1 | 1/2018 | Shin et al. | |
| 2018/0143721 A1 | 5/2018 | Matsueda et al. | |
| 2018/0323240 A1 | 11/2018 | Won et al. | |
| 2019/0139508 A1 | 5/2019 | Park et al. | |
| 2020/0026408 A1 | 1/2020 | Lee et al. | |
| 2020/0091252 A1 | 3/2020 | Bang et al. | |
| 2020/0161398 A1 | 5/2020 | Bang et al. | |
| 2020/0264722 A1 | 8/2020 | Lee et al. | |
| 2020/0393936 A1 * | 12/2020 | Bok | H01Q 1/44 |
| 2021/0208710 A1 | 7/2021 | Han et al. | |
| 2022/0035504 A1 | 2/2022 | Lee et al. | |
| 2022/0216271 A1 | 7/2022 | Kim et al. | |

FOREIGN PATENT DOCUMENTS

| | | |
|---|---|---|
| JP | 2016-024887 A | 2/2016 |
| JP | 2018-113152 A | 7/2018 |
| JP | 2018-189964 A | 11/2018 |
| JP | 2019-086763 A | 6/2019 |
| KR | 1020190081756 A | 7/2019 |
| KR | 10-2020-0057142 A | 5/2020 |
| KR | 1020200082355 A | 7/2020 |
| KR | 102170368 B1 | 10/2020 |
| TW | 201901391 A | 1/2019 |
| TW | 202008138 A | 2/2020 |
| WO | 2016/152518 A1 | 9/2016 |
| WO | 2022/035882 A1 | 2/2022 |

OTHER PUBLICATIONS

Office Action dated Jul. 6, 2022, issued in corresponding Indian Patent Application No. 202114033924.

Notice of Allowance from the Japanese Patent Office dated Dec. 6, 2022, in corresponding JP Patent Application No. 2021-168848.

U.S Non Final Office Action dated Jul. 6, 2023 for counterpart U.S. Appl. No. 18/117,942.

Notice of Allowance dated Oct. 12, 2023, for related U.S. Appl. No. 18/117,942.

Office Action dated Jan. 16, 2024 for related Japanese Patent Application No. 2023-000248.

* cited by examiner

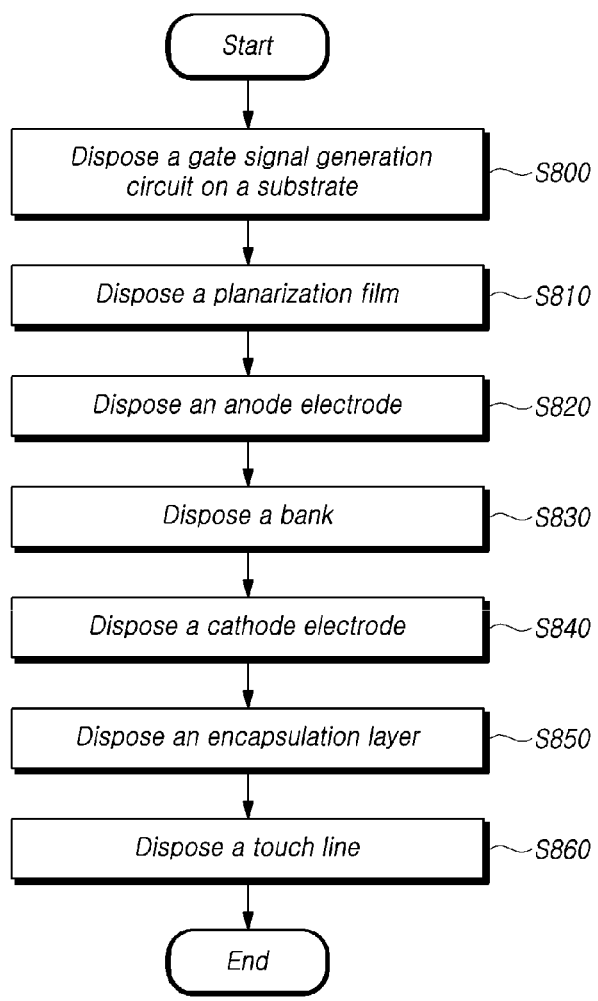

DISPLAY DEVICE INCLUDING TOUCH SENSOR AND MANUFACTURING METHOD FOR THE SAME

CROSS-REFERENCE TO RELATED APPLICATION

This application claims the priority benefit of Korean Patent Application No. 10-2020-0172880, filed on Dec. 11, 2020 in the Korean Intellectual Property Office, the disclosure of which is incorporated herein by reference in its entirety.

BACKGROUND

Technical Field of the Disclosure

The present disclosure relates to display devices including touch sensors and methods of manufacturing the display devices.

Discussion of the Related Art

As the information-oriented society has been developed, various needs for display devices for displaying an image have increased. To satisfy such needs, various types of display devices, such as a Liquid Crystal Display (LCD) device, an Electroluminescence Display (ELD) device, and the like have been developed and utilized.

The ELD device includes a Quantum-dot Light Emitting Display device including a quantum dot (QD), an Inorganic Light Emitting Display device, an Organic Light Emitting Display device, and the like.

Among these display devices, the ELD device has characteristics of a short response time, a wide viewing angle, excellent color gamut, and the like. Further, the ELD device has an advantage that can be implemented as a thin package or structure.

Recently, display devices have increasingly employed touch sensors for sensing a touch. In such display devices, when a user touches the surface of a screen on which images are displayed while watching the images, as the display devices perform an associated operation or present a visual feedback responsive to the touch input detected by a touch sensor, the user is allowed to intuitively operate the display device or other electronic devices employing such a display device. Further, display devices have gradually become thinner for aesthetics or convenience of use.

SUMMARY

However, as a thickness of a display device is smaller, a distance between a touch sensor and a signal line used for displaying images in the display device becomes smaller. When a distance between the touch sensor and the signal line becomes smaller, the touch sensor may recognize a signal and/or a voltage carried through the signal line as a noise, and thereby, incorrectly detect a corresponding touch input due to the wrong recognition.

Further, a display device is needed to form a plurality of stacked films, and outgas may be generated due to moisture that remains in the process of manufacturing the display device. Because of this, there may occur lifting between the plurality of films, and thereby, defects in the display device may be caused.

Accordingly, embodiments of the present disclosure are directed to a display device including a touch sensor and a manufacturing method for the same that substantially obviate one or more of the problems due to limitations and disadvantages of the related art.

An aspect of the present disclosure is to provide a display device including a touch sensor which is capable of preventing the touch sensor from incorrectly detecting a touch by shielding the touch sensor and a corresponding signal line, and preventing defects in the display device from being caused by such outgas, and a method of manufacturing the display device including the touch sensor.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly describe, a display device comprises a substrate including an active area and a non-active area, a planarization film disposed over the substrate, an anode electrode disposed on the planarization film and including a first hole in the non-active area, a bank disposed on the anode electrode, a cathode electrode disposed on the bank, an encapsulation layer disposed on the cathode electrode, and a touch sensor disposed on the encapsulation layer and including a touch line in the non-active area. Here, the first hole may be disposed not to overlap with the touch line.

In another aspect, a method of manufacturing a display device comprises disposing a planarization film over a substrate including an active area and a non-active area, disposing an anode electrode including a first hole in the non-active area, on the planarization film, disposing a bank on the anode electrode, disposing a cathode electrode on the bank, disposing an encapsulation layer on the cathode electrode, and disposing a touch sensor including a touch line in the non-active area, on the encapsulation layer. Here, the first hole may be disposed not to overlap with the touch line.

In accordance with aspects of the present disclosure, by preventing distortion of a touch signal due to noises, it is possible to provide a display device including a touch sensor that is capable of detecting a touch more accurately, and a method of manufacturing the display device.

Further, in accordance with aspects of the present disclosure, it is possible to provide a display device including a touch sensor that is capable of preventing defects in the display device from being caused by moisture, and a method of manufacturing the display device.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 8 is a flow diagram illustrating a method of manufacturing a display device including a touch sensor according to aspects of the present disclosure.

DETAILED DESCRIPTION

Figure 1:
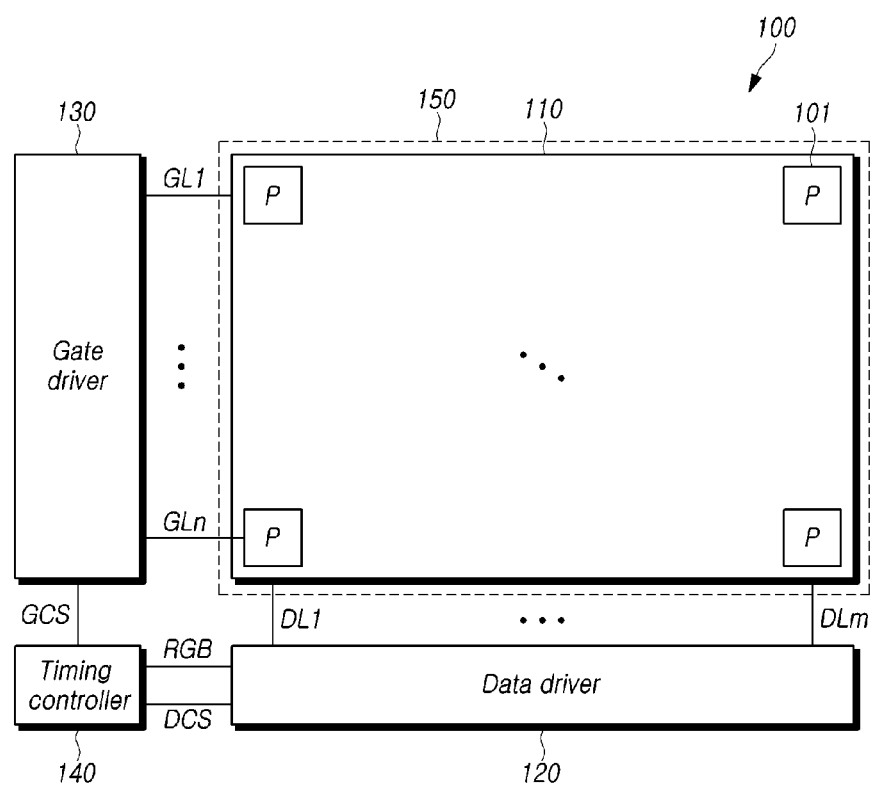
FIG. 1 illustrates a system configuration of a display device according to aspects of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", "comprising of", and "consist of" used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as" "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as 'directly', "only" are used.

Time relative terms, such as "after", "subsequent to", "next to", "before", or the like, used herein to describe a temporal relationship between events, operations, or the like are generally intended to include events, situations, cases, operations, or the like that do not occur consecutively unless the terms, such as "immediately", or the like, are used.

When embodiments related to signal flows are discussed, for example, an embodiment where a signal is transmitted from node A to node B may include the transmission of the signal from node A to node B by way of another node unless the terms such as "directly", "only" are used.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

A display device according to one aspect of the present disclosure includes a substrate including an active area and a non-active area, a planarization film disposed over the substrate, an anode electrode disposed on the planarization film and including a first hole in the non-active area, a bank disposed on the anode electrode, a cathode electrode disposed on the bank, an encapsulation layer disposed on the cathode electrode, and a touch sensor disposed on the encapsulation layer and including a touch line in the non-active area. Here, the first hole may be disposed not to overlap with the touch line.

In the display device, the anode electrode may include a second hole having a size smaller than the first hole, in the non-active area, and the second hole may be disposed to overlap with the touch line.

The touch line of the display device may include a plurality of touch signal lines, and the first hole may be disposed between the plurality of touch signal lines.

A gate signal generation circuit may be disposed below the planarization film in the non-active area of the substrate of the display device, and the cathode and anode electrodes may be disposed to overlap with the gate signal generation circuit.

The first hole of the display device may be disposed to overlap with the gate signal generation circuit.

The encapsulation layer of the display device may include a first inorganic film, a second inorganic film, and an organic film disposed between the first and second inorganic layers.

The first hole of the display device may be disposed at a region in which the planarization film and the bank contact with each other.

In accordance with another aspect of the present disclosure, a method of manufacturing a display device is provided that includes disposing a planarization film over a substrate including an active area and a non-active area, disposing an anode electrode including a first hole in the non-active area, on the planarization film, disposing a bank on the anode electrode, disposing a cathode electrode on the bank, disposing an encapsulation layer on the cathode electrode, and disposing a touch sensor including a touch line in the non-active area, on the encapsulation layer.

Here, the first hole may be disposed not to overlap with the touch line.

In the manufacturing method of the display device, the anode electrode may include a second hole having a size smaller than the first hole, in the non-active area, and the second hole may be disposed to overlap with the touch line.

In the manufacturing method of the display device, the touch line may include a plurality of touch signal lines, and the first hole may be disposed between the plurality of touch signal lines.

In the manufacturing method of the display device, a gate signal generation circuit may be disposed in the non-active area of the substrate before disposing the planarization film, and the cathode and anode electrodes may be disposed to overlap with the gate signal generation circuit.

In the manufacturing method of the display device, the first region may be disposed to overlap with the gate signal generation circuit.

In the manufacturing method of the display device, the encapsulation layer may include a first inorganic film, a second inorganic film, and an organic film disposed between the first and second inorganic layers.

In the manufacturing method of the display device, the first hole may be disposed at a region in which the planarization film and the bank contact with each other.

Hereinafter, with reference to the accompanying drawings, various embodiments of the present disclosure will be described in detail.

FIG. 1 illustrates a system configuration of a display device according to aspects of the present disclosure.

Referring to FIG. 1, the display device 100 includes a display panel 110, a data driver 120, a gate driver 130, and a timing controller 140. The display device 100 can includes one or more touch sensors disposed to overlap with the display panel 100.

The display panel 110 can include a plurality of pixels 101 that are arranged in a matrix form. The plurality of pixels 101 each may emit a red color light, a green color light, a blue color light, or the like. However, light emitted by each pixel according to embodiments herein is not limited thereto. For example, the pixel may emit a white color light. Further, the display panel 110 may have a rectangular shape.

The display panel 110 can include a plurality of gate lines (GL1 to GLn), a plurality of data lines (DL1 to DLm), and a plurality of pixels 101 each connected with each of the plurality gate lines (GL1 to GLn) and each of the plurality lines (DL1 to DLm). Each pixel 101 can receive a data signal through each of the plurality lines (DL1 to DLm) according to a gate signal delivered through each of the plurality gate lines (GL1 to GLn) However, lines arranged in the display panel 110 according to embodiments herein are not limited thereto.

The data driver 120 is connected to the plurality of data lines (DL1 to DLm), and can transfer data signals to the pixels 101 through the plurality of data lines (DL1 to DLm). Here, although FIG. 1 shows a single data driver 120, embodiments of the present disclosure are not limited thereto. For example, the display device includes a plurality of data drivers when desired.

The gate driver 130 is connected to the plurality of gate lines (GL1 to GLn), and can supply gate signals to the pixels 101 through the plurality of gate lines (GL1 to GLn). Here, although FIG. 1 shows that the gate driver 130 is located in one side of the display panel 110, embodiments of the present disclosure are not limited thereto. For example, gate drivers 130 may be disposed in two sides of display panel 110. Further, one of two or more gate drivers may be connected to odd-numbered gate lines, and another, or the other, of the gate drivers may be connected to even-numbered gate lines. Further, the display device 100 may include a gate signal generation circuit for supplying gate signals to the display panel 110 without including a separate gate driver.

The timing controller 140 can control the data driver 120 and the gate driver 130. The timing controller 140 can supply image signals (RGB) and data control signals (DCS) to the data driver 120, and supply gate control signals GCS to the gate driver 130.

The touch sensor 150 may be disposed to overlap with at least a portion of the display panel 110 and can detect a touch performed on the display panel 110 by a user. The touch sensor 150 may include one or more touch electrodes, and one or more touch lines for delivering one or more touch signals to one or more touch electrodes.

Figure 2:
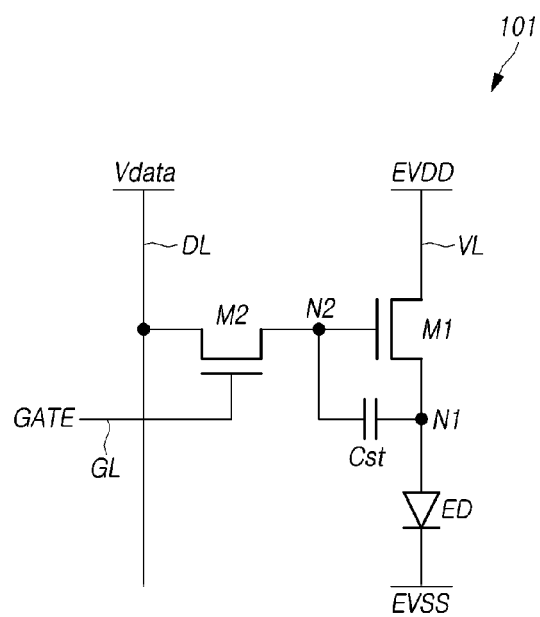
FIG. 2 is a circuit diagram of a pixel used in the display device according to aspects of the present disclosure.

FIG. 2 is a circuit diagram of a pixel used in the display device according to aspects of the present disclosure.

Referring to FIG. 2, the pixel 101 can include a pixel circuit for supplying a driving current, and a light emitting element ED, such as a light emitting diode including an organic light emitting diode, which emits light by the driving current.

The pixel circuit may include a first transistor M1, a second transistor M2, and a storage capacitor Cst.

First and second electrodes of the first transistor M1 may be connected to a first power line VL1 carrying a first power supply voltage EVDD and a first node N1, respectively. Further, a gate electrode of the first transistor M1 may be connected to a second node N2. The first transistor M1 can allow a driving current to flow through the first node N1 according to a voltage applied to the second node N2.

First and second electrodes of the second transistor M2 may be connected to a data line DL and the second node N2, respectively. Further, a gate electrode of the second transistor M2 may be connected to a gate line GL. The second transistor M2 can allow a data signal Vdata delivered through the data line DL to be transferred to the second node N2 according to a gate signal GATE delivered through the gate line GL.

First and second electrodes of the storage capacitor Cst may be connected to the first node N1 and the second node N2, respectively. The storage capacitor Cst may allow a voltage applied to the second node N2 to be maintained.

The light emitting element ED can include an anode electrode, a cathode electrode, and an emissive layer disposed between the anode electrode and the cathode electrode and emitting light when a current flows. The emissive layer may include at least one of an organic material, an inorganic material, and a quantum dot material. The light emitting element ED, such as a light emitting diode including an organic light emitting diode, can receive a driving current flowing through the first node N1, and then, emit light.

The first and second transistors M1 and M2 of the pixel 101 may be NMOS transistors. However, embodiments of the present disclosure are not limited thereto. Further, the first electrodes and the second electrodes of the first and second transformers (M1 and M2) may be drain electrodes and source electrodes, respectively. However, embodiments of the present disclosure are not limited thereto.

Figure 3:
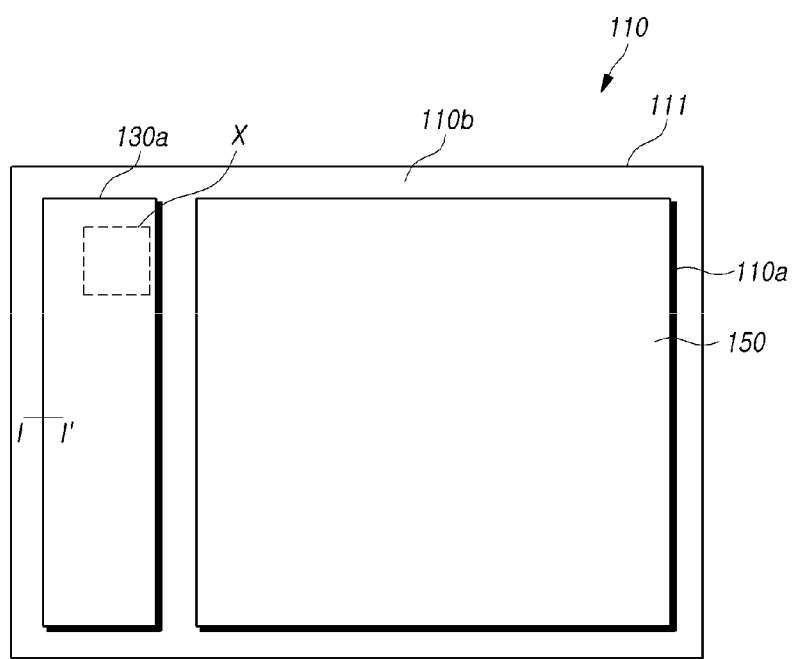
FIG. 3 illustrates that a gate signal generation circuit is disposed on a display panel in a display device according to aspects of the present disclosure.

FIG. 3 illustrates that a gate signal generation circuit is disposed on a display panel in a display device according to aspects of the present disclosure.

Referring to FIG. 3, the display panel 110 may include the gate signal generation circuit 130a disposed on or over a substrate 111. The substrate 111 may include an active area 110a in which one or more pixels 101 are disposed, and a non-active area 110b in which one or more signal lines for carrying a signal and/or a voltage to the active area 110a are disposed. The gate signal generation circuit 130a may be disposed in the non-active area 110b. The gate signal generation circuit 130a may be disposed together with the pixel 101 in a process of disposing the pixel 101 in the active area 110a.

One or more touch sensors 150 may be disposed on or over the substrate 111. The touch sensor 150 may include one or more touch electrodes, and one or more touch lines for delivering one or more touch signals to one or more touch electrodes. The touch electrode may be disposed to overlap with the active area 110*a*, and the touch line may be disposed to overlap with the non-active area 110*b*. The touch line and the signal line may be disposed on different layers in the non-active area 110*b*.

When the touch line is disposed on or over the signal line, a capacitor may be formed between the touch line and the signal line, and a signal flowing through the signal line may act as a noise in the touch line due to such a capacitor.

Here, although FIG. 3 shows that the gate signal generation circuit 130*a* is located on one side of the substrate 111 and disposed to overlap with the substrate 111, embodiments of the present disclosure are not limited thereto. For example, gate signal generation circuits 130*a* may be located in respective sides, such as left and right sides, top and bottom sides, or the like, of the substrate 111 and disposed to overlap with the substrate 111.

Figure 4:
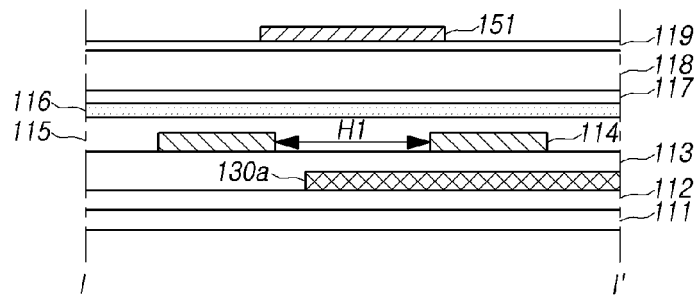
FIG. 4 is a cross-sectional view taken along with line I-I' of FIG. 3 according to a first embodiment.

FIG. 4 is a cross-sectional view taken along with line I-I' of FIG. 3 according to a first embodiment.

Referring to FIG. 4, a gate insulating film 112 may be disposed on the substrate 111, and the gate signal generation circuit 130*a* may be disposed on the gate insulating film 112. Although FIG. 4 shows the gate signal generation circuit 130*a* including a single metal layer; however, it should be noted that this is merely for ease of description. For example, the gate signal generation circuit 130*a* may include a plurality of stacked insulating films and a plurality of metal layers. The gate signal generation circuit 130*a* may include a plurality of transistors.

A planarization film 113 may be disposed on the gate signal generation circuit 130*a*. An anode electrode 114 may be disposed on the planarization film 113.

The planarization film 113 may include photo acryl or polyimide. However, materials or substances that may be included in the planarization film 113 according to embodiments herein are not limited thereto. When the planarization film 113 is exposed to the atmosphere, the planarization film 113 may absorb moisture.

The anode electrode 114 disposed on the planarization film 113 may include a first hole H1. A portion of the planarization film 113 may be exposed through the first hole H1. Due to this, the first hole H1 may serve as a path for outgas through which gas generated by moisture in the planarization film 113 can be discharged. A bank 115 may be disposed on the anode electrode 114. The first hole H1 may be disposed at a region in which the planarization film 113 and the bank 114 contact with each other.

A cathode electrode 116 may be disposed on the bank 115. A first inorganic film 117, an organic film 118, and a second inorganic film 119 may be sequentially stacked on the cathode electrode 116. All or each of the first inorganic film 117, the organic film 118, and the second inorganic film 119 may be an encapsulation layer. A thickness of the organic film 118 may be greater than that of each of the first and second inorganic films 117 and 119. A touch line 151 may be disposed on the second inorganic film 119. The second inorganic film 119 can prevent the organic film 118 from being damaged when the touch line 151 is disposed.

The touch line 151 may be shielded from the gate signal generation circuit 130*a* by the cathode electrode 116 disposed under the touch line 151. However, since the cathode electrode 116 generally has a large process deviation, the cathode electrode 116 may not completely cover the gate signal generation circuit 130*a*. Due to this, as the cathode electrode 116 does not completely shield the gate signal generation circuit 130*a*, noises may be transferred to the touch line 151 by the gate signal generation circuit 130*a*.

Figure 5:
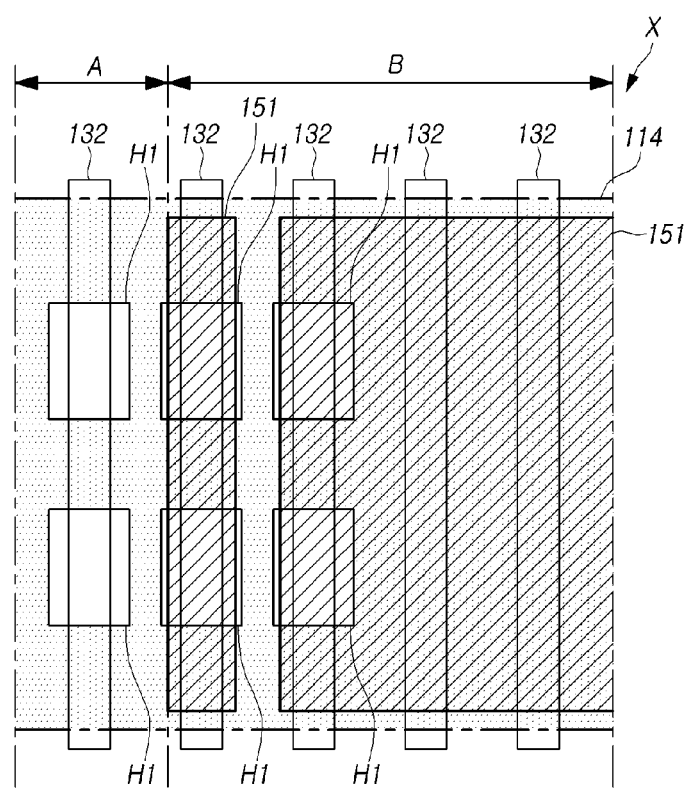
FIG. 5 illustrates a layout of an X-region of FIG. 3 according to aspects of the present disclosure.

FIG. 5 illustrates a layout of an X-region of FIG. 3 according to aspects of the present disclosure.

Referring to FIG. 5, one or more signal lines 132 included in the gate signal generation circuit 130*a* may be disposed on or over the substrate 111. The signal line 132 may be a clock signal line for delivering a clock signal supplied to the gate signal generation circuit 130*a*. However, embodiments of the present disclosure are not limited thereto. The anode electrode 114 may be disposed on one or more signal lines 132. A touch line 151 may be disposed on the anode electrode 114.

The anode electrode 114 may include a plurality of first holes H1. The plurality of first holes H1 may be disposed in three columns each including some of the plurality of first holes H1. However, embodiments of the present disclosure are not limited thereto.

The plurality of first holes H1 may be disposed not to overlap with the touch sensor 150. One of the three columns of the first holes H1 is disposed in a first region A in which the touch line 151 and the signal line 132 do not overlap with each other, and the other two columns of the first holes H1 may be disposed in a second region B in which the touch line 151 and the signal line 132 overlap with each other.

As the first hole H1 is disposed in the anode electrode 114, thus, a path for outgas through which gas generated from the planarization film 113 can travel can be provided, and as a result, it is possible to prevent defects in the display device 100 from being caused.

Although the cathode electrode 116 is not shown in FIG. 5, the cathode electrode 116 may cover at least a portion or all of one or more signal lines 132.

The plurality of first holes H1 may be disposed in the first region A in which the touch line 151 and the signal line 132 do not overlap with each other, and disposed in the second region B in which the touch line 151 and the signal line 132 overlap with each other. The anode electrode 114 may cause the signal line 132 and the touch line 151 not to be shielded due to at least one first hole H1 disposed in the second region B.

Figure 6:
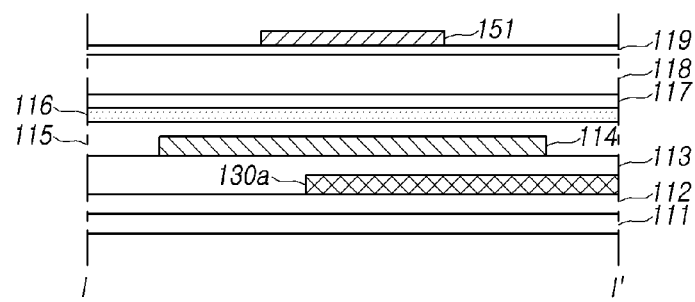
FIG. 6 is a cross-sectional view taken along with line I-I' of FIG. 3 according to a second embodiment.

FIG. 6 is a cross-sectional view taken along with line I-I' of FIG. 3 according to a second embodiment.

Referring to FIG. 6, a gate insulating film 112 may be disposed on the substrate 111, and the gate signal generation circuit 130*a* may be disposed on the gate insulating film 112 and disposed in a region corresponding to at least a portion of the non-active area 110*b*. Although FIG. 6 shows the gate signal generation circuit 130*a* including a single metal layer; however, it should be noted that this is merely for ease of description. For example, the gate signal generation circuit 130*a* may include a plurality of insulating films and a plurality of metal layers. The gate signal generation circuit 130*a* may include a plurality of transistors.

A planarization film 113 may be disposed on the gate signal generation circuit 130*a*. An anode electrode 114 may be disposed on the planarization film 113, and a cathode electrode 116 may be disposed on the anode electrode 114. The planarization film 113 may include photo acryl or polyimide. When the planarization film 113 is exposed to the atmosphere, the planarization film 113 may absorb moisture. A bank 115 may be disposed on the anode electrode 114.

A cathode electrode 116 may be disposed on the bank 115. A first inorganic film 117, an organic film 118, and a second inorganic film 119 may be sequentially stacked on the cathode electrode 116. All or each of the first inorganic film 117, the organic film 118, and the second inorganic film 119 may be an encapsulation layer. A thickness of the organic film 118 may be greater than that of each of the first and second inorganic films 117 and 119. A touch line 151 may be disposed on the second inorganic film 119. The second inorganic film 119 can prevent the organic film 118 from being damaged when the touch line 151 is disposed.

The touch line 151 may be shielded from a signal line 132 by the cathode electrode 116 disposed under the touch line 151. The touch line 151 may be shielded from the signal line 132 by the anode electrode 114 disposed under the cathode electrode 116.

Even when the cathode electrode 116 generally has a large process deviation, and thus, the cathode electrode 116 does not completely cover the touch line 151, as the touch line 151 can be shielded by the anode electrode 114, it is possible prevent noises from being transferred to the touch line 151.

Figure 7A:
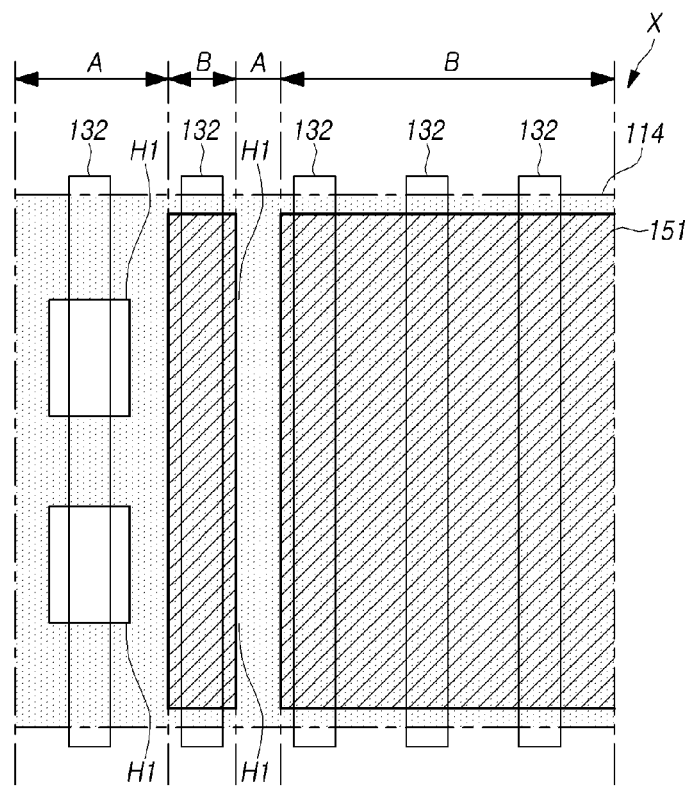
FIGS. 7A to 7C illustrate layouts of the X-region of FIG. 3 according to aspects of the present disclosure.
Figure 7B:
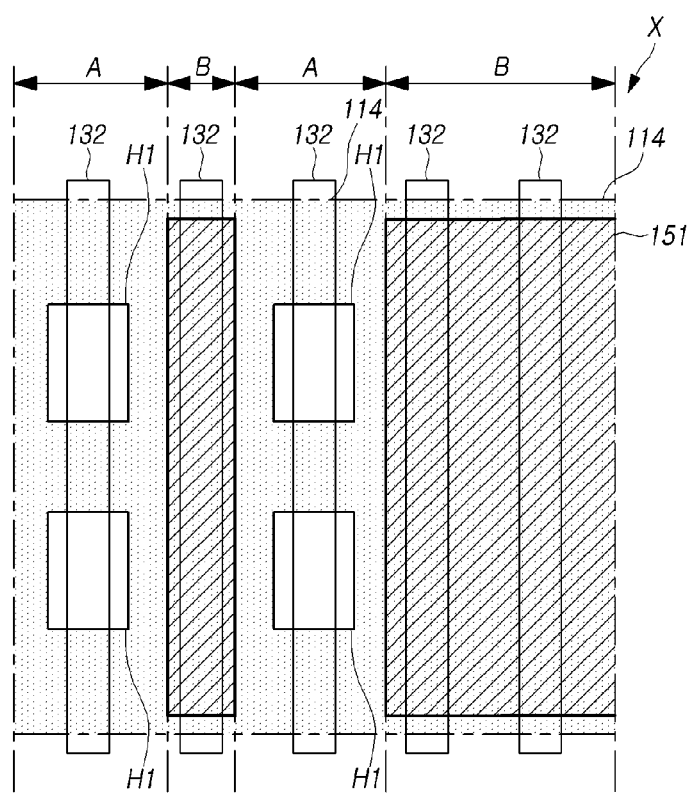
Figure 7C:
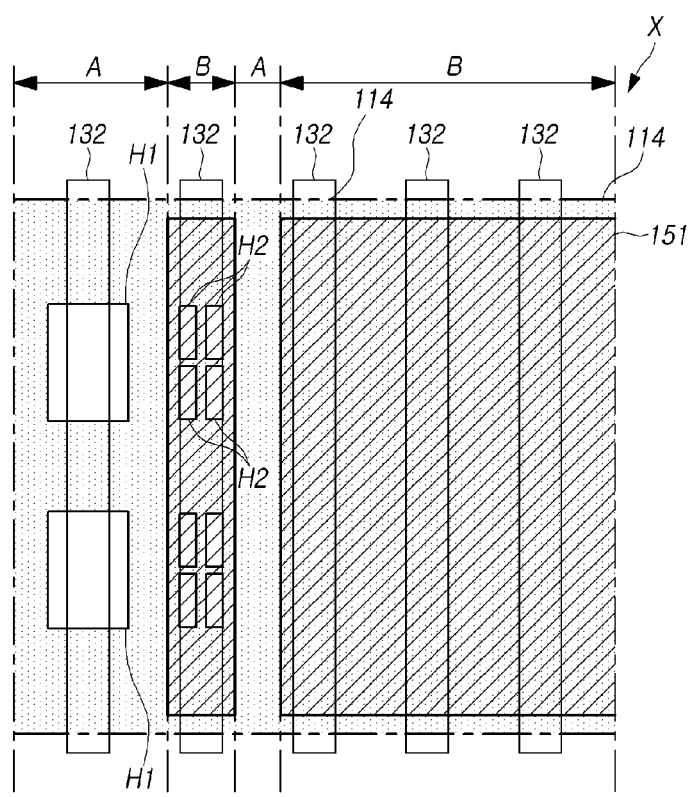

FIGS. 7A to 7C illustrate layouts of the X-region of FIG. 3 according to aspects of the present disclosure.

Referring to FIGS. 7A to 7C, one or more signal lines 132 included in the gate signal generation circuit 130a may be disposed on or over the substrate 111. The signal line 132 may be a clock signal line for delivering a clock signal supplied to the gate signal generation circuit 130a. However, embodiments of the present disclosure are not limited thereto.

An anode electrode 114 may be disposed on one or more signal lines 132. A touch line 151 may be disposed on the anode electrode 114. The anode electrode 114 may include a plurality of first holes H1.

Although the cathode electrode 116 is not shown in FIGS. 7A to 7C, the cathode electrode 116 may cover at least a portion or all of one or more signal lines 132.

Referring to FIG. 7A, the plurality of first holes H1 may be disposed in a first region A among the first region A in which a touch line 151 and one or more signal lines 132 do not overlap with each other and a second region B in which the touch line 151 and the signal line 132 overlap with each other. Further, the first hole H1 may be disposed at a region in which the planarization film 113 and the bank 115 contact with each other.

Table 1 below shows a comparison between noises in Sample 1, for example, a display device employing the anode electrode shown in FIG. 5 and noises in Sample 2, for example, a display device employing the anode electrode shown in FIG. 7A.

TABLE 1

|   | Sample 1 | | | Sample 2 | | |
| --- | --- | --- | --- | --- | --- | --- |
|   | Gclk (mV) | Cathode (mV) | Rx (mV) | Gclk (mV) | Cathode (mV) | Rx (mV) |
| 1 | 15.69 | 23.00 | 55.96 | 15.71 | 21.45 | 51.55 |
| 2 | 15.70 | 24.72 | 61.16 | 15.69 | 22.00 | 56.77 |
| 3 | 15.70 | 23.03 | 61.07 | 15.73 | 23.61 | 64.54 |
| 4 | 15.71 | 21.59 | 67.77 | 15.71 | 24.64 | 53.38 |
| 5 | 15.71 | 21.19 | 51.84 | 15.73 | 21.12 | 65.19 |
| Min | 15.69 | 21.19 | 51.84 | 15.69 | 21.12 | 51.55 |
| Max | 15.71 | 24.72 | 67.77 | 15.73 | 24.64 | 65.19 |
| Avg | 15.70 | 22.71 | 59.59 | 15.71 | 22.56 | 58.29 |

In above Table 1, Gclk represents voltages of clock signals output from gate signal generation circuits, and Cathode represents voltages of cathode electrodes. Further, Rx represents voltages of touch signals output from touch lines. Five display devices were used to measure voltages of the clock signals, voltages of the cathode electrodes and voltages of the touch signals.

Referring to Table 1 above, minimum, maximum, and average values of each of the voltage of the cathode electrode and the voltage of the touch signal which are measured in Sample 1 (e.g. the display device employing the anode electrode shown in FIG. 5) are larger than respective minimum, maximum, and average values of each of the voltage of the cathode electrode and the voltage of the touch signal which are measured in Sample 2 (e.g. the display device employing the anode electrode shown in FIG. 7A).

It can be seen that noise shielding of the touch sensor 150 is improved when the first hole H1 is removed from a region of the anode electrode 114 overlapping with the gate signal generation circuit 130a.

Referring to FIG. 7B, the plurality of first holes H1 may be disposed in a first region A among the first region A in which a touch line 151 and one or more signal lines 132 do not overlap with each other and a second region B in which the touch line 151 and the signal line 132 overlap with each other. The touch line 151 may include a plurality of touch signal lines, and the first region A may be a region disposed between the plurality of touch signal lines. The plurality of first holes H1 may not be disposed in the second region B where the touch line 151 and the signal line 132 overlap with each other. Accordingly, the anode electrode 114 may shield the touch line 151 from the signal line 132 in the second region B where the touch line 151 and the signal line 132 overlap with each other.

Referring to FIG. 7C, the plurality of first holes H1 may be disposed in a first region A among the first region A in which a touch line 151 and one or more signal lines 132 do not overlap with each other and a second region B in which the touch line 151 and the signal line 132 overlap with each other. Further, one or more second holes H2 with a size smaller than the first hole H1 may be disposed in the second region B in which the touch line 151 and the signal line 132 overlap with each other. Even though the size of the second hole H2 formed in the anode electrode 114 in the second region B is small, the noise shielding of the touch sensor 150 can be improved.

A sum of sizes of the second holes H2 corresponding to one first hole H1 may be determined to be smaller than half of the size of the first hole H1. In FIG. 7C, the sum of respective sizes of four second holes H2 may be smaller than half of a size of one first hole H1.

As shown in FIGS. 7A to 7C, at least one of the first hole H1 and the second hole H2 is disposed on the planarization film 113, and provide a path through which outgas can be discharged, and thereby, it is possible to prevent defects in the display device 100 from occurring.

FIG. 8 is a flow diagram illustrating a method of manufacturing a display device including a touch sensor according to aspects of the present disclosure.

Referring to FIG. 8, a planarization film 113 may be disposed on or over a substrate 111, at step S810. The substrate 111 may be formed of glass or polyamide. The planarization film 113 may be formed of photo acryl or polyimide. When the planarization film 113 is exposed to the atmosphere, the planarization film 113 may absorb moisture.

A gate signal generation circuit 130a may be disposed on the substrate 111 before the planarization film 113 is disposed on the substrate 111, at step S800. The gate signal generation circuit 130a may be disposed in a non-active area 110b on or over the substrate 111. The gate signal generation circuit 130a may be disposed on a side of the substrate 111.

Gate signal generation circuits 130a may be disposed on both sides of the substrate 111, for example, left and right sides, top and bottom sides, and the like.

The gate signal generation circuit 130a may be formed by patterning a conductive layer and may include a signal line 132. The signal line 132 may include a clock signal line for delivering a clock signal to the gate signal generation circuit 130a. The gate signal generation circuit 130a may include a plurality of transistors. A gate signal generation circuit 130a may be disposed in a non-active area 110b on or over the substrate 111 together with the pixels 101 when one or more pixels 101 are disposed on or over the substrate 111.

An anode electrode 114 may be disposed on the planarization film 113, at step S820. The anode electrode 114 may include one or more first hole H1. As the first hole H1 formed in the anode electrode 114 provides a path of outgas through which gas generated from the planarization film 113 can travel can be provided, as a result, it is possible to prevent defects in the display device 100 from being caused. The first hole H1 may be disposed to overlap with the gate signal generation circuit 130a in the non-active area 110b.

A bank 115 may be disposed on the anode electrode 114, and the bank 115 may be disposed to overlap with the first hole H1, at step S830.

A cathode electrode 116 may be disposed on the bank 115, at step S840. The cathode electrode 116 may cover an upper portion of the substrate 111. The cathode electrode 116 may cover an upper portion of the gate signal generation circuit 130a. The cathode electrode 116 may shield the gate signal generation circuit 130a. However, in a corresponding manufacturing process, since the cathode electrode 116 generally has a large process deviation, and thus, may cover only a part of the upper portion of the gate signal generation circuit 130a, there is a probability that an effect of using the cathode electrode 116 for shielding the gate signal generation circuit 130a may be degraded.

An encapsulation layer may be disposed on the cathode electrode 116, at step S850. The encapsulation layer may include a first inorganic film 117, a second inorganic film 119, and an organic film 118 disposed between the first and second inorganic films 117 and 119. A thickness of the organic film 118 may be greater than that of each of the first and second inorganic films 117 and 119. The encapsulation layer can serve to prevent the penetration of foreign substances including moisture and air.

A touch sensor 150 may be disposed on the encapsulation layer. The touch sensor 150 may include a touch electrodes and a touch line 151. Further, the second inorganic film 119 can prevent the organic film 118 from being damaged when the touch sensor 150 is disposed.

The first hole H1 may be disposed not to overlap with the touch line 151. The first holes H1 may be disposed in a first region A among the first region A in which the touch line 151 and one or more signal lines 132 do not overlap with each other and a second region B in which the touch line 151 and the signal line 132 overlap with each other. Since the first hole H1 included in the anode electrode 114 is disposed not to overlap with the touch line 151, the touch line 151 and the signal line 132 can be shielded by the anode electrode 114. Accordingly, as double shielding for the gate signal generation circuit 130a can be performed, the shielding of the gate signal generation circuit 130a can be improved.

The touch line 151 may include a plurality of touch signal lines, and the first hole H1 may be disposed between the plurality of touch signal lines. Further, one or more second holes H2 with a size smaller than the first hole H1 may be disposed in the second region B in which the touch line 151 and the signal line 132 overlap with each other.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device comprising:
a substrate including an active area, in which a plurality of pixels are disposed, and a non-active area outside the active area;
a planarization film disposed over the substrate;
an anode electrode disposed in the non-active area on the planarization film and including a first hole penetrating through the anode electrode in the non-active area;
a bank disposed on the anode electrode;
a cathode electrode disposed on the bank;
an encapsulation layer disposed on the cathode electrode; and
a touch sensor disposed on the encapsulation layer and including a touch line in the non-active area,
wherein the first hole is disposed not to overlap with the touch line.

2. The display device according to claim 1, wherein the anode electrode in the non-active area further includes a second hole penetrating through the anode electrode and having a size smaller than the first hole, and
wherein the second hole is disposed to overlap with the touch line.

3. The display device according to claim 1, wherein the touch line includes a plurality of touch signal lines, and the first hole is disposed between the plurality of touch signal lines.

4. The display device according to claim 1, further comprising a gate signal generation circuit disposed below the planarization film in the non-active area,
wherein the cathode and anode electrodes are disposed to overlap with the gate signal generation circuit.

5. The display device according to claim 4, wherein the first hole is disposed to overlap with the gate signal generation circuit.

6. The display device according to claim 1, wherein the encapsulation layer comprises:
a first inorganic film;
a second inorganic film; and
an organic film disposed between the first and second inorganic films.

7. The display device according to claim 1, wherein the first hole is disposed in a region in which the planarization film and the bank contact with each other.

8. A method of manufacturing a display device, the method comprising:
disposing a planarization film over a substrate including an active area, in which a plurality of pixels are disposed, and a non-active area outside the active area;
disposing an anode electrode in the non-active area on the planarization film, the anode electrode including a first hole penetrating through the anode electrode in the non-active area;
disposing a bank on the anode electrode;
disposing a cathode electrode on the bank;
disposing an encapsulation layer on the cathode electrode; and disposing a touch sensor on the encapsulation layer, the touch sensor including a touch line in the non-active area, wherein the first hole is disposed not to overlap with the touch line.

9. The method according to claim 8, wherein the anode electrode in the non-active area further includes a second hole penetrating through the anode electrode and having a size smaller than the first hole, and wherein the second hole is disposed to overlap with the touch line.

10. The method according to claim 8, wherein the touch line includes a plurality of touch signal lines, and the first hole is disposed between the plurality of touch signal lines.

11. The method according to claim 8, further comprising disposing a gate signal generation circuit in the non-active area of the substrate before disposing the planarization film, wherein the cathode and anode electrodes are disposed to overlap with the gate signal generation circuit.

12. The method according to claim 11, wherein the first hole is disposed to overlap with the gate signal generation circuit.

13. The method according to claim 8, wherein the encapsulation layer comprises:

a first inorganic film;

a second inorganic film; and an organic film disposed between the first and second inorganic films.

14. The method according to claim 8, wherein the first hole is disposed in a region in which the planarization film and the bank contact with each other.

15. The method of claim 8, wherein the first hole penetrates through a top surface and a bottom surface of the anode electrode in the non-active area.

16. The method of claim 8, wherein the anode electrode in the non-active area surrounds all lateral sides of the first hole in a plan view.

17. The display device of claim 1, wherein the first hole penetrates through a top surface and a bottom surface of the anode electrode in the non-active area.

18. The display device of claim 1, wherein the anode electrode in the non-active area surrounds all lateral sides of the first hole in a plan view.

* * * * *